(12) United States Patent
Wang et al.

(10) Patent No.: US 8,273,597 B2
(45) Date of Patent: Sep. 25, 2012

(54) PROCESS FOR MAKING SOLAR PANEL AND THE SOLAR PANEL MADE THEREOF

(75) Inventors: Chiou Fu Wang, Yonghe (TW); Huo-Hsien Chiang, Taipei (TW)

(73) Assignee: Du Pont Apollo Ltd., New Territories (HK)

( * ) Notice: Subject to any disclaimer, the term of this patent is extended or adjusted under 35 U.S.C. 154(b) by 145 days.

(21) Appl. No.: 12/945,593

(22) Filed: Nov. 12, 2010

(65) Prior Publication Data

US 2011/0114150 A1 May 19, 2011

Related U.S. Application Data

(60) Provisional application No. 61/261,878, filed on Nov. 17, 2009.

(51) Int. Cl.
*H01L 31/02* (2006.01)

(52) U.S. Cl. .......... 438/68; 136/244; 257/E31.11
(58) Field of Classification Search .......... 136/244, 136/245; 257/E31.032, E31.11, E31.124; 438/57, 68, 98
See application file for complete search history.

(56) References Cited

U.S. PATENT DOCUMENTS 5,334,259 A * 8/1994 Mizumura et al. .......... 136/258
* cited by examiner

*Primary Examiner* — Julio J Maldonado
*Assistant Examiner* — Daniel Shook
(74) *Attorney, Agent, or Firm* — Sughrue Mion, PLLC

(57) ABSTRACT

The present invention provides a process for making solar panels. The process of the present invention avoids the use of laser scribing so it is particularly useful in making flexible solar panels. In addition, the present invention provides an alternative scheme for connecting the first electrodes and second electrodes in a solar panel.

20 Claims, 1 Drawing Sheet

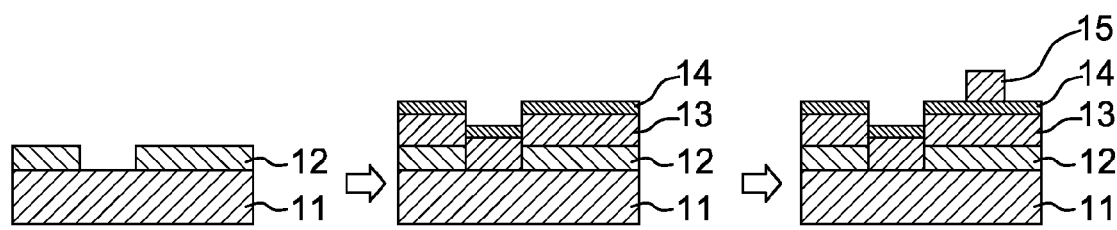
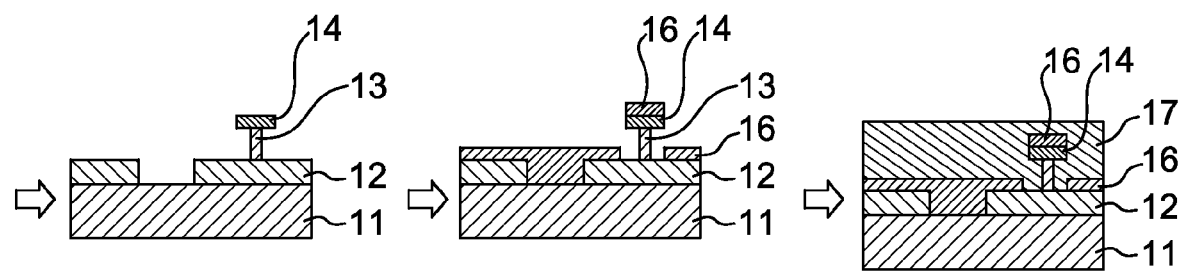

PROCESS FOR MAKING SOLAR PANEL AND THE SOLAR PANEL MADE THEREOF

FIELD OF THE INVENTION

The present invention relates to the manufacture of a thin film solar panel. More particularly, the present invention relates to the manufacture of a thin film solar panel using a bi-layer process to avoid substrate degradation.

BACKGROUND OF THE INVENTION

A photovoltaic cell or solar cell converts light energy into electric energy. A standard solar cell includes a transparent substrate, a transparent first electrode, a photoelectric conversion element and a second electrode which are sequentially disposed on a substrate. Typical materials for a transparent substrate are glass and plastic materials.

Recently, flexible solar panels become popular due to their ease of use, portability and versatility. In a flexible solar panel, polymeric materials, particularly polyimide or polyethylene-naphtalate (PEN), and thin metal films such as stainless steel sheet are normally used as substrates. However, due to the different properties of polymers, it is impractical to apply the conventional process for a solar panel with glass to the case with a polymeric substrate or a thin metal film substrate. For example, laser scribing which is commonly used for patterning cells cannot be applied onto a polymer or a thin substrate because the heat generated would seriously damage the polymer or the thin substrate.

A standard process of fabricating flexible solar panels usually includes interconnecting several small cells together with metallic ribbons to form a higher voltage solar panel. The reason that most people do not take a monolithic approach when making flexible solar panels is that flexible substrates are too fragile to survive laser or mechanical scribing. Other processes, such as standard photolithography, are too expensive to be used in mass production. Therefore, an alternative process for making a flexible solar panel is desired.

SUMMARY OF THE INVENTION

The present invention provides a novel process for making a thin film solar panel without the use of laser scribing or other heat-generating processes and therefore is particularly useful in making a flexible solar panel.

The process of the present invention comprises the steps of:

(a) providing a substrate with patterned first electrodes thereon;

(b) sequentially depositing a layer of a first material and a layer of a second material on the substrate with patterned first electrodes;

(c) forming a plurality of patterned photoresists on the layer of the second material and at a plurality of conductive channels;

(d) wet etching the layer of the first material and the layer of the second material to form a plurality of T-shaped structures at the conductive channels, wherein the etching rate for the first material is higher than that for the second material;

(e) depositing at least one semiconductor film on the substrate with the patterned first electrodes to form photoelectrical conversion elements;

(f) depositing at least one second electrode on the semiconductor film, so as to electrically connect the second electrodes to the first electrodes at the conductive channels; and (g) scribing the second electrodes and semiconductor film to separate individual cell to form a solar panel.

Another object of the present invention is to provide an alternative scheme for connecting first electrodes with second electrodes in a solar panel.

Yet another object of the present invention is to provide a solar panel comprising a T-shaped structure therein.

BRIEF DESCRIPTION OF THE DRAWING

FIGS. 1(a) to (f) show a schematic process flow for a unit cell according to the present invention.

DETAILED DESCRIPTION OF THE INVENTION

The present invention is illustrated below in detail by the embodiments with reference to the drawings, which are not intended to limit the scope of the present invention. It will be apparent that any modifications or alterations that are obvious for persons skilled in the art fall within the scope of the disclosure of the specification.

The first step of the process of the present invention is providing a substrate 11 with patterned first electrodes 12 thereon, as shown in FIG. 1(a). The patterned first electrodes 12 can be used as front electrodes or back electrodes according to the demands. The materials of the substrate can be materials such as glass, silicon, metal and polymers. In this embodiment of the present invention, the preferred materials are flexible polymers, preferably polyimide or PEN. The making of the patterned first electrodes is a conventional technique and has been discussed in various publications, for example, U.S. Pat. No. 5,334,259. Generally, flexible solar cells are fabricated using substrate architecture due to the lack of transparency of the flexible substrates, such as polyimide.

In this embodiment of the present invention, the material for the first electrode is a transparent conducting oxide (TCO). Suitable TCO materials include metal oxides of Ag, Al, Cu, Cr, Zn, Mo, Wo, Ca, In, Sn, Ba, Ti or Ni, preferably oxides of Zn or Sn or BaTiO. The TCO layer may be optionally doped with metals such as Al, Ga, Sb, e.g., ZnO:Al (AZO), ZnO:Ga (GZO) and SnO2:Sb (ATO). The TCO is normally patterned by laser scribing or etching techniques. However, when the substrate is a polymer, laser scribing should be avoided because the heat generated by laser scribing causes serious damage to the substrate.

Unlike conventional process in which a photoelectrical conversion layer is directly deposited on the substrate with patterned electrodes, a layer of a first material 13 and a layer of a second material 14 are sequentially deposited (see FIG. 1(b)). The layers, after patterned in a later step, will serve as masks during the deposition of a semiconductor film. In certain preferred embodiments, the layers also provide a conductive connection between first and second electrodes, which will be described later.

Suitable first material and second material include, but are not limited to metals, oxides, nitrides, carbon nanotubes or polymers. The selection of the first and second materials is only restricted by the etching selectivity because a T-shaped structure consisting of the first and the second materials should be formed by wet etching. The etching rate to the first material is required to be higher than the etching rate to the second material. Suitable etching selectivity is not limited and is determined by the desired aspect of the T-shaped structure, for example, higher etching selectivity resulting in a T-shaped structure with larger upper portion and lower etching selectivity resulting in a T-shaped structure with relative smaller upper portion. Normally, the etching selectivity of the first material to the second material is in a range of 2:1 to 1000:1.

In a preferred embodiment of the present invention, the first material is a conductive material so as to provide an electrical connection between first electrodes and second electrodes through the first material even if the first electrodes and second electrodes are not directly connected. The conductive material includes, but is not limited to, metals, carbon nanotubes or conductive polymers.

In another preferred embodiment of the present invention, both the first and second materials are conductive materials so as to provide an electrical connection between first electrodes and second electrodes through the first and second materials even if the first and second electrodes are not directly connected and the second electrodes are not directly connected to the first material.

The thickness of the layer of the second material is not critical and is ranging from 100 nm to 30 μm. The thickness of the layer of the first material should be greater than that of the semiconductor film to be deposited later so that the semiconductor film on the T-shaped structure (formed later) and that on the first electrodes are disconnected. This allows the second electrodes to be formed to connect with either the first electrodes or the T-shaped structure at the conductive channels. In one embodiment of the present invention, the thickness of the layer of the first material is at least 200 nm greater than that of the semiconductor film. Moreover, suitable thickness of the layer of the first material is in a range of 300 nm to 30 μm.

After the deposition of the layer of the first material and the layer of the second material, photoresist is deposited and patterned, so as to form a patterned photoresist 15. The patterned photoresist 15 is located in the regions where the first electrodes exist, as shown in FIG. 1(*c*). Specifically, the patterned photoresist 15 is formed at the conductive channels. The deposition of the photoresist is a skill known in the art and the patterning can be done by any conventional means such as photolithography, printing, slot-coating and maskless laser patterning.

After the patterning of the photoresist, wet etching is employed. Due to the selectivity of the first and second materials and the isotropic nature of wet-etching, a T-shaped structure is formed. Wet etching by etchants, including chemicals and etching pastes, is also a skill known in the art.

After the formation of the T-shaped structure at the conductive channels, at least one semiconductor film 16 is then deposited to form photoelectrical conversion elements. The photoelectrical conversion elements can be any types such as single-, tandem- or triple-junction elements and they can be made by any suitable means described in prior art references such as U.S. Pat. No. 5,334,259. It is likely that the first electrodes beneath the T-shaped structures, which serve as masks, are not completely covered by the semiconductor film, i.e., at least part of the surface of the first electrodes are exposed and the width of the region of each first electrode which is not covered by the semiconductor film is typically in a range of 10 to 200 μm. This allows the first electrodes directly connect with the second electrodes at the conductive channels. However, such direct contact of first electrodes and second electrodes is not necessary in certain preferred embodiments of the present invention.

In one preferred embodiment of the present invention, the first material of the T-shaped structure is conductive so the electrical connection between the first and second electrodes can be done via the first material of the T-shaped structures.

In an even preferred embodiment of the present invention, both the first and second materials of the T-shaped structures are conductive. Alternatively, the first and the second materials of the T-shaped structures are non-conductive according to the demands. The first electrodes and second electrodes can be electrically connected as long as the first electrodes and the T-shaped structures are not both covered by the semiconductor film.

In one embodiment of the present invention, the photoelectrical conversion elements are amorphous silicon thin film photovoltaic devices and the amorphous silicon is preferably deposited by DC biased plasma enhanced chemical vapor deposition (PECVD). In another embodiment, the photoelectrical conversion elements are Copper Indium Gallium (di) Selenide (CIGS) thin film photovoltaic devices, and the CIGS is preferably deposited by co-evaporation or co-sputtering. The main point in both cases is that the photoelectrical conversion elements do not entirely block the conductive path between first and second electrodes.

After the formation of the photoelectrical conversion elements, a conductive film 17 is then deposited as second electrodes. Oblique sputtering is preferred so the regions beneath the T-shaped structures can be filled, as shown in FIG. 1(*f*). Other methods with good step coverage capability such as Metal-Organic Chemical Vapor Deposition (MOCVD) can be also applied. The angle of oblique sputtering is not limited as long as the second electrodes contact with the first electrodes or the conductive part of the T-shaped structures. Other process conditions for the manufacture of the second electrodes can be found in prior art references and are similar to the previous descriptions for the first electrodes.

It should be noted that semiconductor materials are normally sensitive to the environment. For example, when amorphous silicon exposes to the atmosphere, absorbs moisture quickly and the reliability would be significantly affected. According to the process of the present invention, the step of depositing a semiconductor film is directly followed by the step of depositing a conductive film for second electrodes so the duration of the semiconductor film exposing to the atmosphere would be greatly reduced. Thus, the process according to the present invention provides an additional advantage over conventional schemes.

Finally, the second electrode film and semiconductor film are subject to a laser scribing or an etching, such as etching paste, to separate individual cells (not shown in the figure) and the solar panel is obtained.

The present invention also provides a solar panel of a novel architecture. The solar panel comprises a substrate, first electrodes, a T-shaped structure which is composed of a first material and a second material on each first electrode, photoelectrical conversion elements and second electrodes.

A preferred embodiment of the solar panel of the present invention is prepared by the process according to the present invention, which has been described above.

EXAMPLE

A polyimide was provided as the substrate. First electrodes were patterned on the substrate by laser-scribing techniques.

Al was chosen as the first material for this embodiment of the present invention while Ag was chosen as the second material. These two materials were sequentially deposited on the substrate by sputtering or evaporation according to the demands. The thicknesses of the first and second materials were 1 μm and 500 nm, respectively.

A patterned photoresist was then formed in the regions with the patterned first electrodes, that is, the patterned photoresist is formed at the conductive channel. Wet etching by KOH based etchant was applied to form the T-shaped structure as shown in FIG. 1(*d*). The etching rate for Al (the first material) to Ag (the second material) was about 5:1.

Finally, amorphous silicon film was deposited to form photoelectrical conversion elements by PECVD and Al was deposited by sputtering to form a second electrode layer. The second electrode layer and conversion elements were laser-scribed to form a solar panel according to the present invention.

What is claimed is:

1. A process for making a flexible solar panel comprising the steps of:
   (a) providing a substrate with patterned first electrodes thereon;
   (b) sequentially depositing a layer of a first material and a layer of a second material on the substrate with patterned first electrodes;
   (c) forming a plurality of patterned photoresists on the layer of the second material and at a plurality of conductive channels;
   (d) wet etching the layer of the first material and the layer of the second material to form a plurality of T-shaped structures at the conductive channels, wherein the etching rate for the first material is higher than that for the second material;
   (e) depositing at least a semiconductor film on the substrate with the patterned first electrodes to form photoelectrical conversion elements;
   (f) depositing at least one second electrode on the semiconductor film, so as to electrically connect the second electrodes to the first electrodes at the conductive channels; and
   (g) scribing the second electrodes and semiconductor film to separate individual cell to form a solar panel.

2. The process of claim 1, wherein the semiconductor film deposited in step (e) does not completely cover the first electrodes and the first electrodes directly connect with the second electrodes.

3. The process of claim 2, wherein the width of the region of each first electrode which is not covered by the semiconductor film is in a range of 10 to 200 μm.

4. The process of claim 1, wherein the first material is electrically conductive.

5. The process of claim 4, wherein the semiconductor material in step (e) completely covers the first electrodes but does not completely cover the first material of the T-shaped structures and the T-shaped structures connect both the first electrodes and the second electrodes.

6. The process of claim 4, wherein the second material is electrically conductive.

7. The process of claim 6, wherein the semiconductor film deposited in step (e) completely covers the first electrodes and the first material of the T-shaped structures but does not completely cover the second material of the T-shaped structure and the T-shaped structures connect the first electrodes and the second electrodes.

8. The process of claim 1, wherein the substrate is flexible.

9. The process of claim 8, wherein the substrate is made of polyimide or poly-ethylene-naphtalate (PEN).

10. The process of claim 1, wherein the first material is selected from metals, oxides, nitrides, carbon nanotubes or polymers.

11. The process of claim 1, wherein the second material is selected from metals, oxides, nitrides, carbon nanotubes or polymers.

12. The process of claim 1, wherein the etching selectivity of the first material to the second material is in a range of 2:1 to 1000:1.

13. The process of claim 1, wherein the thickness of the layer of the first material deposited in step (b) is greater than that of the semiconductor film deposited in step (e).

14. The process of claim 13, wherein the thickness of the layer of the first material is 300 nm to 30 μm.

15. The process of claim 1, wherein the thickness of the layer of the second material is 100 μm to 30 nm.

16. The process of claim 1, wherein the patterning of the photoresist is conducted by printing, photolithography, slot-coating or maskless laser patterning.

17. The process of claim 1, wherein the semiconductor film is an amorphous silicon film.

18. The process of claim 1, wherein the semiconductor film is a Copper Indium Gallium (di)Selenide (CIGS) film.

19. A solar panel comprising a substrate, first electrodes, a T-shaped structure which is composed of a first material and a second material on each of the first electrode, photoelectrical conversion elements and second electrodes.

20. A solar panel made by the process of claim 1, comprising a substrate, first electrodes, a T-shaped structure which is composed of a first material and a second material on each of the first electrode, photoelectrical conversion elements and second electrodes.

* * * * *